United States Patent
Cao

(10) Patent No.: US 8,546,217 B2
(45) Date of Patent: Oct. 1, 2013

(54) FLASH MEMORY AND METHOD FOR FORMING THE SAME

(75) Inventor: Steam Cao, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 13/596,900

(22) Filed: Aug. 28, 2012

(65) Prior Publication Data

US 2013/0134495 A1 May 30, 2013

(30) Foreign Application Priority Data

Nov. 24, 2011 (CN) .......................... 2011 1 0379488

(51) Int. Cl.
*H01L 21/8247* (2006.01)
(52) U.S. Cl.
USPC .................................. 438/267; 257/E21.179
(58) Field of Classification Search
USPC .......................... 438/257–267; 257/E21.179
See application file for complete search history.

(56) References Cited

U.S. PATENT DOCUMENTS 6,271,090 B1 * 8/2001 Huang et al. .................. 438/264
2010/0311603 A1 12/2010 Roux et al.

* cited by examiner

*Primary Examiner* — Richard Booth
(74) *Attorney, Agent, or Firm* — Harness, Dickey & Pierce, P.L.C.

(57) ABSTRACT

A flash memory cell is provided. The flash memory cell includes: a substrate with a source line thereon; a word line and a word line dielectric layer on each side of the source line; an isolating dielectric layer which isolates the source line from the word line and the word line dielectric layer on each side of the source line; a gate stack on an outer side of each word line dielectric layer, including a floating gate dielectric layer, a floating gate, a control gate dielectric layer and a control gate; a first spacer, disposed on an outer sidewall of each word line dielectric layer and on each control gate; and a source region in the substrate and in contact with the source line. The space may be saved and the costs may be reduced.

12 Claims, 7 Drawing Sheets

FLASH MEMORY AND METHOD FOR FORMING THE SAME

CROSS REFERENCE TO RELATED APPLICATIONS

The present application claims priority to Chinese Patent Application No. CN201110379488.X, filed on Nov. 24, 2011, and entitled "FLASH MEMORY AND METHOD FOR FORMING THE SAME", the entire disclosure of which is incorporated herein by reference.

FIELD OF THE DISCLOSURE

The present disclosure generally relates to semiconductor manufacturing, and more particularly, to a flash memory and a method for forming the same.

BACKGROUND OF THE DISCLOSURE

Read only memory (ROM), a kind of non-volatile memory, does not lose stored information and data even when power off. Erasable programmable ROM (EPROM) further develops ROM's application into capability of data erasable and rewriteable. However, erasing data in an EPROM requires ultraviolet rays, which raises cost of EPROM. Furthermore, all the programs or data stored in the EPROM are erased indiscriminately in an erasing process even only a portion of them are aimed to be erased. Therefore, for each data alternation, the whole flash memory needs to be reprogrammed, which is time-wasting.

Another kind of data erasable memory, electrically erasable programmable ROM (EEPROM), does not have above disadvantages, in which data can be erased and rewritten bit by bit, facilitating repeated programming, reading and erasing.

FIG. 1 is a schematic cross-sectional view of a memory cell in a conventional EEPROM.

Referring to FIG. 1, the memory cell includes a substrate 100, a storage transistor 10 and a selection transistor 20 disposed on the substrate 100. The storage transistor 10 and the selection transistor 20 are spaced apart. The storage transistor 10 includes a first gate stack on a top surface of the substrate 100, a first source region 109 and a first drain region in the substrate 100 and on opposite sides of the first gate stack. The selection transistor 20 includes a second gate stack, a second source region and a second drain region 107 in the substrate 100 and on opposite sides of the second gate stack, where the first drain region of the storage transistor 10 and the second source region of the select transistor 20 overlap with each other, forming a common doping region 108 which connects the storage transistor 10 and the selection transistor 20. The first gate stack of the storage transistor 10 includes a tunneling oxide layer 101, a floating gate 102, a control gate oxide layer 103 and a control gate 104 successively formed on the top surface of the substrate 100. The second gate stack of the select transistor 20 includes a gate oxide layer 105 and a gate electrode 106 successively formed on the top surface of the substrate 100. An N-well is formed in the substrate 100. The second drain region 107, the first source region 109 and the common doping region 108 are all P-type doped.

Erasing operation of the memory cell includes: applying positive voltages to the gate electrode 106 (coupled to a word line) of the select transistor 20 and to the first source region 109 (coupled to a source line) of the storage transistor 10, applying a negative voltage to the control gate 104 of the storage transistor 10, and configuring the second drain region 107 (coupled to a bit line) of the selection transistor 20 to open. By doing this, electrons stored in the floating gate 102 of the storage transistor 10 may pass through the tunneling oxide layer 101 and be transferred to the first source region 109, which accomplishes erasing the memory cell.

More information about manufacturing EEPROM devices may be referred to U.S. Patent Publication No. US2010/0311603A1.

However, the memory cell of the conventional EEPROM includes a storage transistor and a selection transistor which are spaced apart from each other. A common doping region is necessary to realize the connection of the two above-mentioned transistors, which increases difficulty in shrinking the memory cell. Therefore, the whole EEPROM including a plurality of memory cells may have a relatively large size and occupy a relatively large space, which increase the manufacturing costs.

Therefore, there is a need for a flash memory and a method for forming the same to reduce the size of a memory cell and decrease the manufacturing costs.

BRIEF SUMMARY OF THE DISCLOSURE

According to an embodiment of the present disclosure, a method for forming a flash memory cell is provided. The method includes: providing a substrate; successively forming a first dielectric layer, a first polysilicon layer, a second dielectric layer, a second polysilicon layer and a hard mask layer on the substrate; successively etching the hard mask layer, the second polysilicon layer, the second dielectric layer, the first polysilicon layer and the first dielectric layer to form an opening to expose a portion of the substrate; successively forming a third dielectric layer and a third polysilicon layer over the hard mask layer and the opening's sidewalls and bottom surface; etching the third polysilicon layer and the third dielectric layer to expose the hard mask layer and a portion of the substrate, the remaining third polysilicon layer and the remaining third dielectric layer forming a word line and a word line dielectric layer on each of the opening's sidewalls; implanting ions into the exposed portion of the substrate to form a source region; forming a source line on the surface of the source region of the exposed semiconductor substrate, and an isolating dielectric layer between the source line and each word line; removing the hard mask layer; forming a first spacer on a side of each word line dielectric layer away from the word line; and successively etching the second polysilicon layer, the second dielectric layer, the first polysilicon layer and the first dielectric layer with the first spacers as a mask until the substrate is exposed, to form a gate stack comprising a control gate, a control gate dielectric layer, a floating gate and a floating gate dielectric layer on each side of the source line.

Optionally, forming the source line comprises: forming a spacer over the word line dielectric layer's sidewall and part of the word line's sidewall, wherein the spacer acts as an isolating dielectric layer between the word line and the source line to be formed; filling the opening up with polysilicon until the polysilicon covers the word lines and the hard mask layer; chemical mechanical polishing the polysilicon until the hard mask layer is exposed; and etching back the polysilicon in the opening to expose the word line and part of the isolating dielectric layer.

Optionally, the source line's top surface is lower than the isolating dielectric layer's top surface.

Optionally, the method further includes forming isolating structures in the semiconductor substrate, which extends into the first dielectric layer and further into the first polysilicon layer.

Optionally, the first dielectric layer, the second dielectric layer and the third dielectric layer include silicon dioxide.

Optionally, the hard mask layer includes silicon nitride.

Optionally, the hard mask layer includes a thickness ranging from about 2000 Å to about 4000 Å.

Optionally, the first spacer includes silicon dioxide.

Optionally, the third dielectric layer is formed by a high temperature CVD process.

Optionally, after the gate stack is formed, the method further includes forming a second spacer on a sidewall of the gate stack on a side of the gate stack away from the source line.

Optionally, the second spacer comprises silicon nitride.

Optionally, after the gate stack is formed, forming a drain region in the substrate on a side of each gate stack away from the source line.

A flash memory cell is provided by an embodiment of the present disclosure. The flash memory cell includes: a substrate; a source line on the substrate; a word line and a word line dielectric layer on each side of the source line, wherein the word line dielectric layer comprises a part disposed between the word line and the substrate and another part disposed on an outer sidewall of the word line; an isolating dielectric layer which isolates the source line from the word line and the word line dielectric layer on each side of the source line; a gate stack on a side of each word line dielectric layer far away from the word line, wherein the gate stack comprises a floating gate dielectric layer, a floating gate, a control gate dielectric layer and a control gate, and a top surface of the gate stack is lower than a top surface of the word line dielectric layer; a first spacer, disposed on each control gate and on a side of each word line dielectric layer far away from the word line; and a source region in the substrate and in contact with the source line.

Optionally, the source line's top surface is lower than the isolating dielectric layer's top surface.

Optionally, the flash memory cell further includes a second spacer disposed on a sidewall of each gate stack on an outer side of each gate stack.

Optionally, the flash memory cell further includes a drain region disposed in the substrate on an outer side of each gate stack.

Compared with prior art, embodiments of the present disclosure have following advantages.

In the flash memory cell, the control gate, the control gate dielectric layer, the floating gate and the floating gate dielectric layer (which correspond to the gate stack of the conventional floating transistor), together with the word line and the word line dielectric layer (which correspond to the gate stack of the conventional select transistor), are formed as an integral structure, so the conventional common doping region is no longer necessary. The size of the memory cell is reduced and the manufacturing costs are decreased.

Further, the first spacer includes silicon dioxide, which may effectively protect the substance below due to a relatively high polysilicon/silicon dioxide etching selectivity.

DETAILED DESCRIPTION OF THE DISCLOSURE

Figure 1:
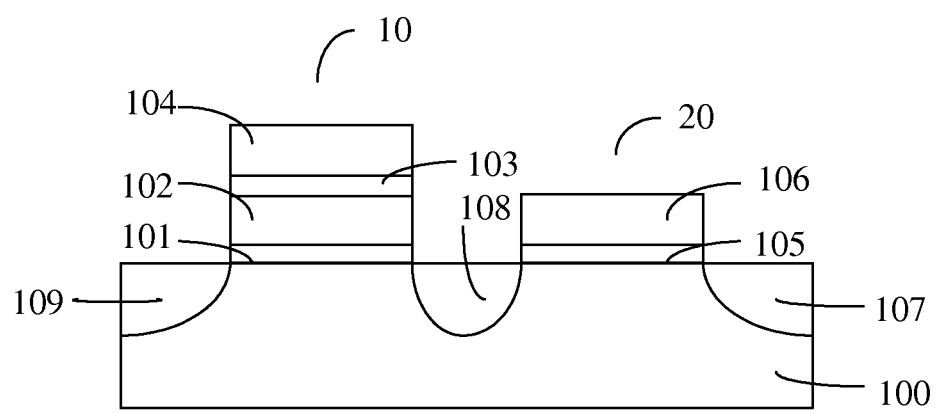
FIG. 1 is a schematic cross-sectional view of a memory cell in a conventional EEPROM.

As described above, the memory cell of the conventional EEPROM includes a storage transistor and a selection transistor which are spaced apart from each other. A common doping region is necessary to realize the connection of the two above-mentioned transistors, which increases difficulty in shrinking the memory cell. Therefore, the whole EEPROM including a plurality of memory cells may have a relatively large size and occupy a relatively large space, which increase the manufacturing costs.

Therefore, a method for forming a flash memory cell is provided in an embodiment of the present disclosure. The method includes the following process steps: providing a substrate; successively forming a first dielectric layer, a first polysilicon layer, a second dielectric layer, a second polysilicon layer and a hard mask layer on the substrate; successively etching the hard mask layer, the second polysilicon layer, the second dielectric layer, the first polysilicon layer and the first dielectric layer to form an opening which exposes a portion of the substrate; successively forming a third dielectric layer and a third polysilicon layer over the hard mask layer and the opening's sidewalls and bottom surface; etching the third polysilicon layer and the third dielectric layer until the hard mask layer and a portion of the substrate are exposed, so as to form a word line and a word line dielectric layer on each of the opening's sidewalls; implanting ions into the exposed portion of the substrate to form a source region therein; forming a source line on the source region and an isolating dielectric layer between the source line and each word line; removing the hard mask layer; forming a first spacer on an outer sidewall of each word line dielectric layer; and by using the first spacer as a mask, successively etching the second polysilicon layer, the second dielectric layer, the first polysilicon layer and the first dielectric layer until the substrate is exposed, so as to form a gate stack including a control gate, a control gate dielectric layer, a floating gate and a floating gate dielectric layer.

A flash memory cell formed by using the method described above according to an embodiment of the present disclosure includes: a substrate; a source line on the substrate; a word line and a word line dielectric layer on each side of the source line, wherein the word line dielectric layer includes a part disposed between the word line and the substrate and another part disposed on an outer sidewall of the word line; an isolating dielectric layer which isolates the source line from the word line and the word line dielectric layer; a gate stack on an outer side of each word line dielectric layer, wherein the gate stack includes a floating gate dielectric layer, a floating gate, a control gate dielectric layer and a control gate, and a top surface of the gate stack is lower than a top surface of the word line dielectric layer; a first spacer, disposed on an outer sidewall of each word line dielectric layer and on each control gate; and a source region in the substrate and in contact with the source line. The flash memory cell is formed with self-alignment methodology. Furthermore, a common doping region between the select transistor and the storage transistor is no longer necessary, which contributes to shrinking the memory cell's size and reducing the manufacturing costs.

It should be noted that, in the description of the present disclosure, the "outer sidewall" is a sidewall of a certain substance (for example, the word line) which is farther from the source line compared with the substance's other sidewalls. Similarly, the "outer side" is a side of a certain substance (for example, the word line dielectric layer) which is farther from the source line compared with the substance's other sides.

In order to clarify the objects, characteristics and advantages of the disclosure, embodiments of the disclosure will be interpreted in detail in combination with accompanied drawings. It should be noted that, in the accompanying drawings, for convenience of description, the sizes and relative positions of elements are not necessarily drawn to scale. For example, some of these elements are arbitrarily enlarged and positioned to improve drawing legibility. The accompanying drawings are merely examples which should not limit the scope of the present disclosure. Besides, in practical manufacturing, the device is actually a three-dimensional structure, including length, width and depth.

Figure 2:
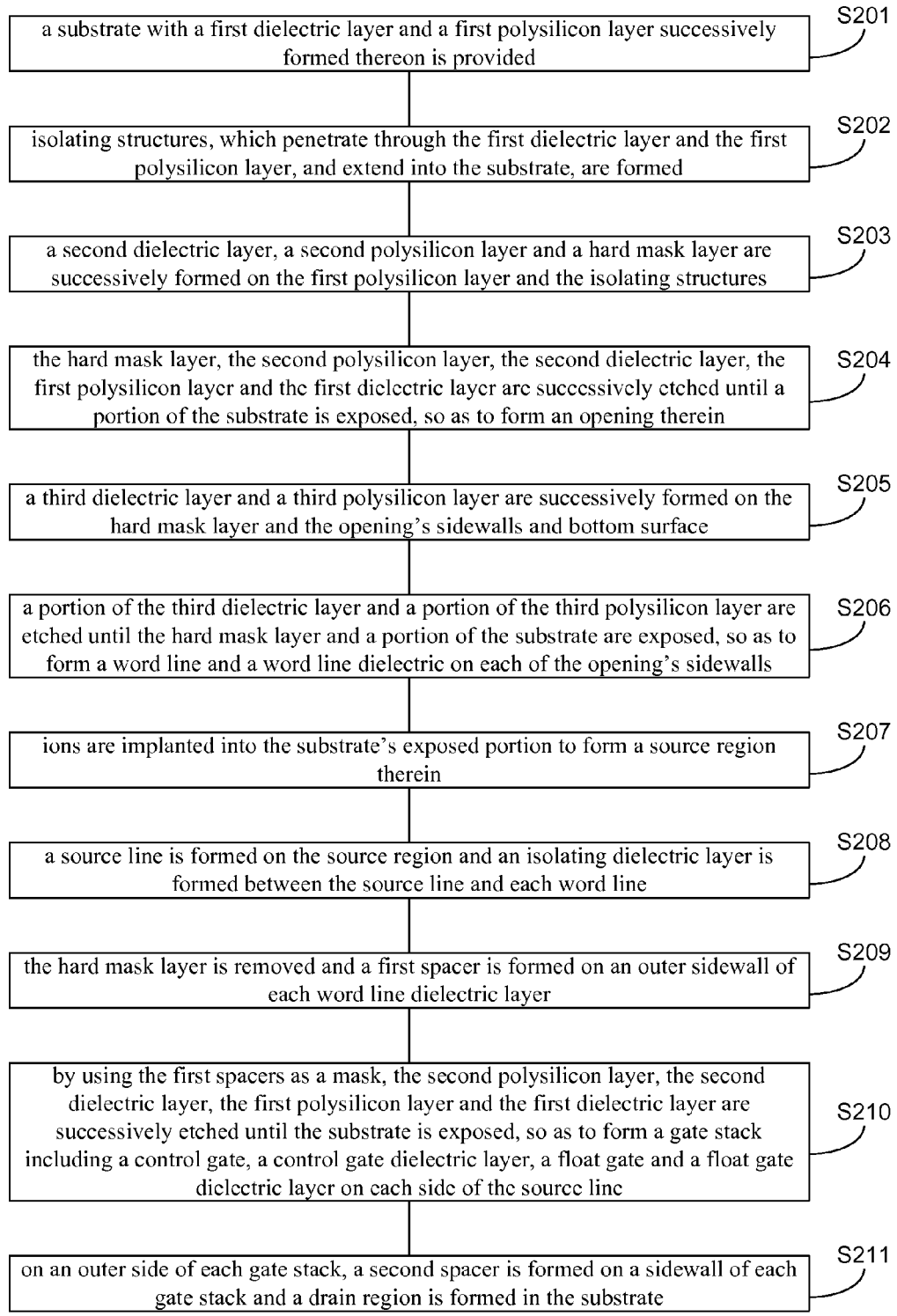
FIG. 2 is a flow chart illustrating a method for forming a flash memory cell according to an embodiment of the present disclosure.

FIG. 2 is a flow chart illustrating a method for forming a flash memory cell according to an embodiment of the present disclosure. Referring to FIG. 2, the method includes steps as follows.

At step S201, a substrate with a first dielectric layer and a first polysilicon layer successively formed thereon is provided.

At step S202, isolating structures, which penetrate through the first dielectric layer and the first polysilicon layer, and extend into the substrate, are formed.

At step S203, a second dielectric layer, a second polysilicon layer and a hard mask layer are successively formed on the first polysilicon layer and the isolating structures.

At step S204, the hard mask layer, the second polysilicon layer, the second dielectric layer, the first polysilicon layer and the first dielectric layer are successively etched until a portion of the substrate is exposed, so as to form an opening therein.

At step S205, a third dielectric layer and a third polysilicon layer are successively formed on the hard mask layer and the opening's sidewalls and bottom surface.

At step S206, a portion of the third dielectric layer and a portion of the third polysilicon layer are etched until the hard mask layer and a portion of the substrate are exposed, so as to form a word line and a word line dielectric on each of the opening's sidewalls.

At step S207, ions are implanted into the substrate's exposed portion to form a source region therein.

At step S208, a source line is formed on the source region and an isolating dielectric layer is formed between the source line and each word line.

At step S209, the hard mask layer is removed and a first spacer is formed on an outer sidewall of each word line dielectric layer.

At step S210, by using the first spacers as a mask, the second polysilicon layer, the second dielectric layer, the first polysilicon layer and the first dielectric layer are successively etched until the substrate is exposed, so as to form a gate stack including a control gate, a control gate dielectric layer, a floating gate and a floating gate dielectric layer on each side of the source line.

And at step S211, on an outer side of each gate stack, a second spacer is formed on a sidewall of each gate stack and a drain region is formed in the substrate.

Figure 11:
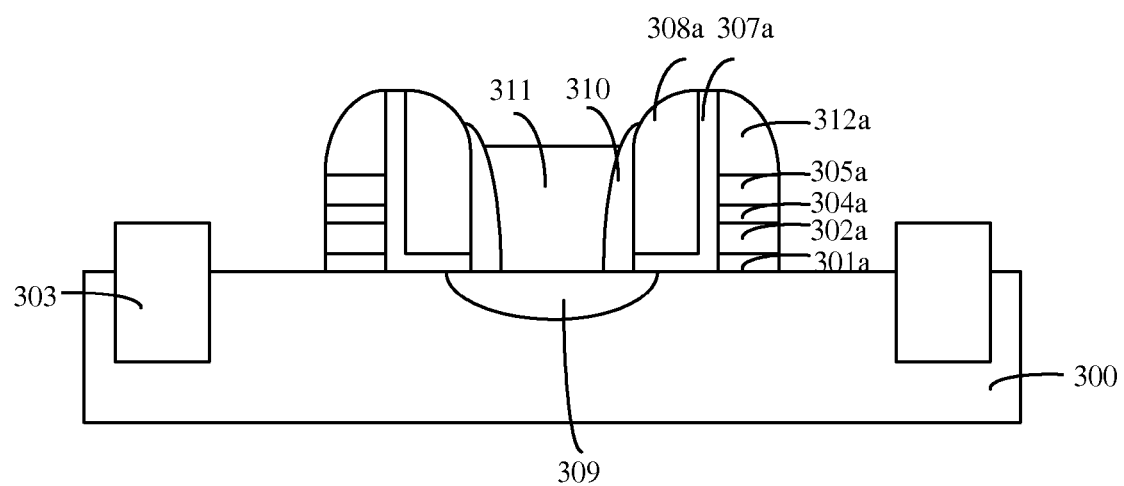
Figure 12:
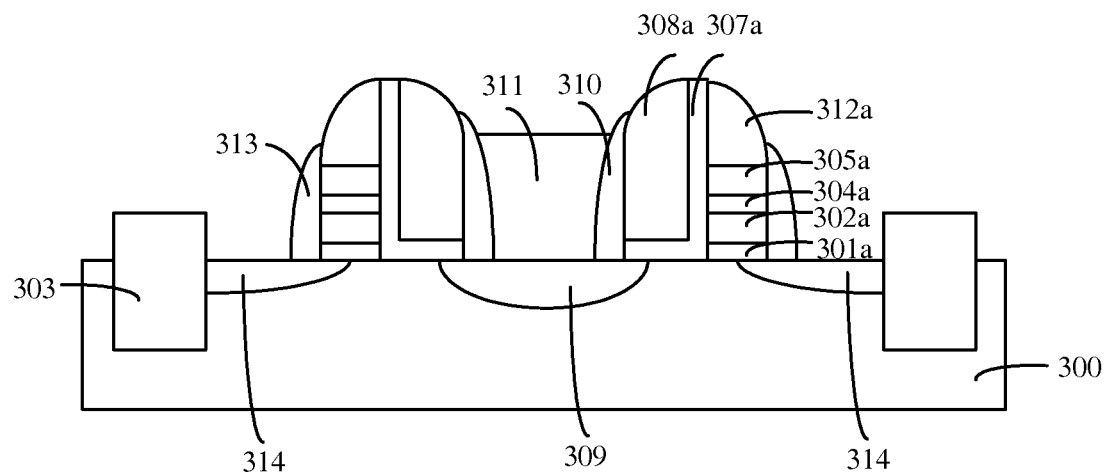
Figure 13:
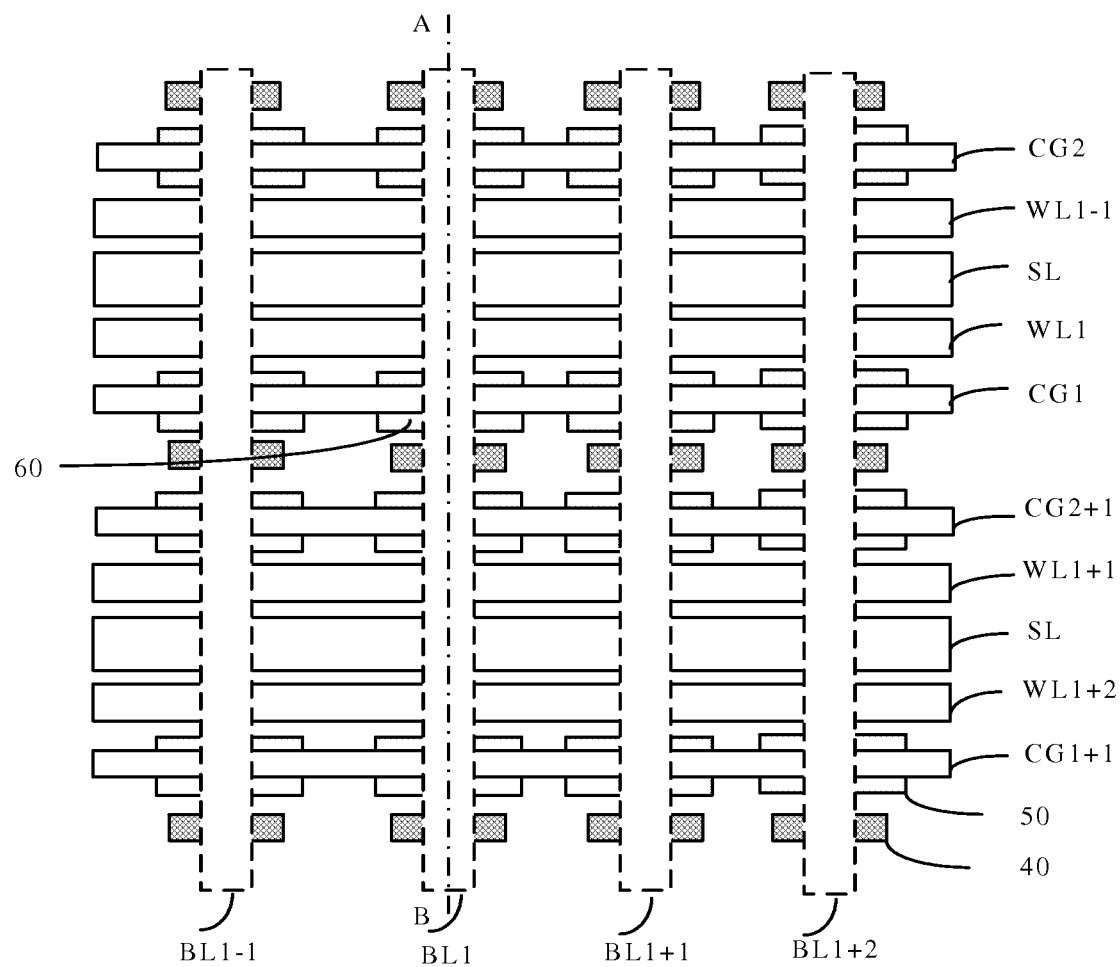
FIG. 13 is a schematic top view of a flash memory block including a plurality of flash memory cells formed according to an embodiment of the present disclosure.

FIGS. 3 to 12 are schematic cross-sectional views of intermediate structures along an A-B direction shown in FIG. 13, illustrating a method for forming a flash memory cell according to an embodiment of the present disclosure. It should be noted that FIG. 13 is a schematic top view of a flash memory block including a plurality of flash memory cells. Along the A-B direction in FIG. 13, flash memory cells disposed between each pair of neighboring isolating structures 40 share the same structure. To describe the embodiment clearly and concisely, only one of the flash memory cells is taken as an example hereinafter.

Figure 3:
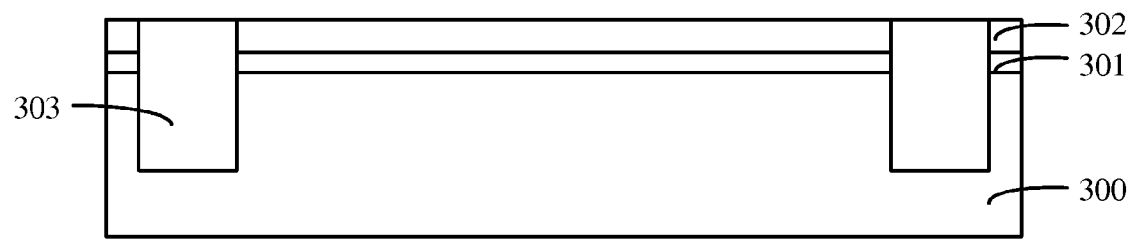
FIGS. 3 to 12 are schematic cross-sectional views of intermediate structures along a A-B direction shown in FIG. 13, illustrating a method for forming a flash memory cell according to an embodiment of the present disclosure.

Referring to FIG. 3, a substrate 300 is provided with a first dielectric layer 301 and a first polysilicon layer 302 successively formed thereon. And isolating structures 303, which penetrate through the first dielectric layer 301 and the first polysilicon layer 302, and extend into the substrate 300, are formed.

An N-well, which is not shown in the accompanying drawings, is also formed in the substrate 300.

The first dielectric layer 301 is adapted for forming floating gate dielectric layers and the first polysilicon layer 302 is adapted for forming floating gates in subsequent steps. The floating gate dielectric layers act as tunneling oxide layers disposed between the floating gates and the substrate. The first dielectric layer 301 is formed by a thermal oxide or CVD process, includes silicon dioxide and has a thickness ranging from about 80 Å to about 120 Å. The first polysilicon layer 302 is formed by a CVD process, has a thickness ranging from about 200 Å to about 600 Å, and includes doped polysilicon which is doped with phosphorus ions.

The isolating structures 303 are formed as follows. A patterned photoresist layer including openings corresponding to the isolating structures 303 is formed over the first polysilicon layer 302; the first polysilicon layer 302, the first dielectric layer 301 and the substrate 300 are successively etched with the patterned photoresist layer used as a mask, so that trenches corresponding to the isolating structures are formed; and the isolating structures 303 are formed by filling the trenches completely with dielectric materials. The isolating structures 303 are used to isolate active regions. The isolating structures 303 are formed after the formation of the first polysilicon layer 302, which may achieve a desirable alignment. Therefore, polysilicon deviation may be avoided, which is possible to occur if the isolating structure are formed in advance.

Figure 4:
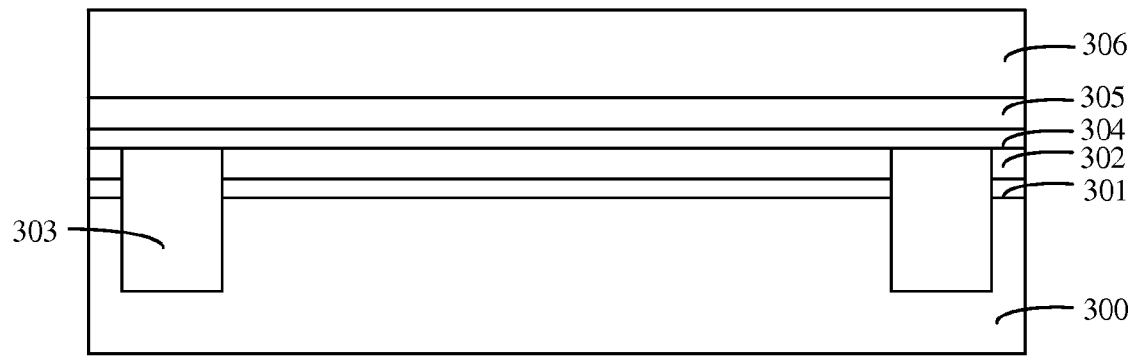

Referring to FIG. 4, a second dielectric layer 304, a second polysilicon layer 305 and a hard mask layer 306 are successively formed on the first polysilicon layer 302 and the isolating structures 303.

The second dielectric layer 304 is adapted for forming control gate dielectric layers and the second polysilicon layer 305 is adapted for forming control gates in subsequent steps. The control gate dielectric layers act as isolating layers disposed between the control gates and the floating gates. The second dielectric layer 304 is formed by a CVD process, includes silicon dioxide or an ONO structure, and has a thickness ranging from about 120 Å to about 150 Å. The second polysilicon layer 305 is formed by a CVD process, and has a thickness ranging from about 300 Å to about 600 Å. The second polysilicon layer 305 includes doped polysilicon.

The hard mask layer 306 is formed by a CVD process, and has a thickness ranging from about 2000 Å to about 4000 Å.

Figure 5:
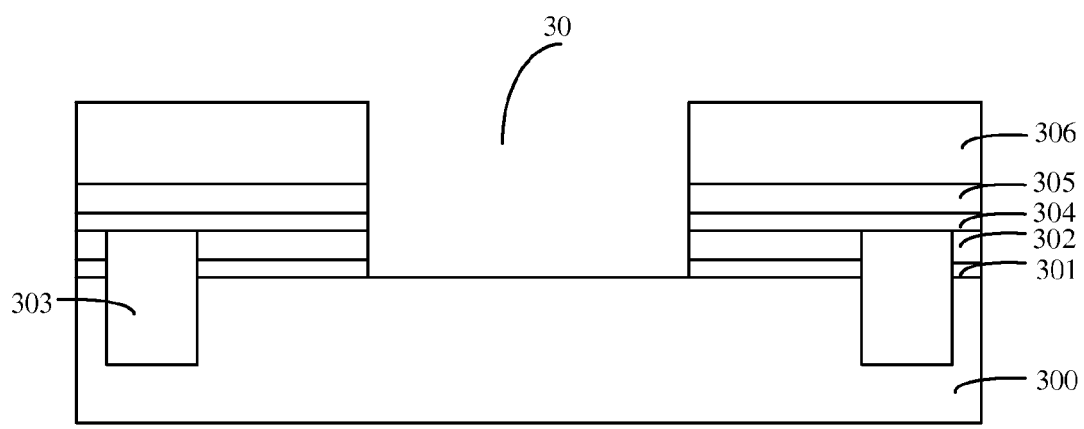

Referring to FIG. 5, the hard mask layer 306, the second polysilicon layer 305, the second dielectric layer 304, the first polysilicon layer 302 and the first dielectric layer 301 are successively etched to form an opening 30 from which a portion of the substrate is exposed.

The opening 30 is formed as follows. A patterned photoresist layer which exposes a portion of the hard mask layer 306 to be etched is formed on the hard mask layer 306; and the hard mask layer 306, the second polysilicon layer 305, the second dielectric layer 304, the first polysilicon layer 302 and the first dielectric layer 301 are successively etched to formed the opening 30, with the patterned photoresist layer used as a mask.

Specifically, the hard mask layer 306 and the second dielectric layer 304 are respectively etched with wet etching processes which respectively apply hot phosphoric acid and dilute hydrofluoric acid as etchants.

The second polysilicon layer 305 and the first polysilicon layer 302 are respectively etched with plasma dry etching processes by applying HBr as etch gases.

Figure 6:
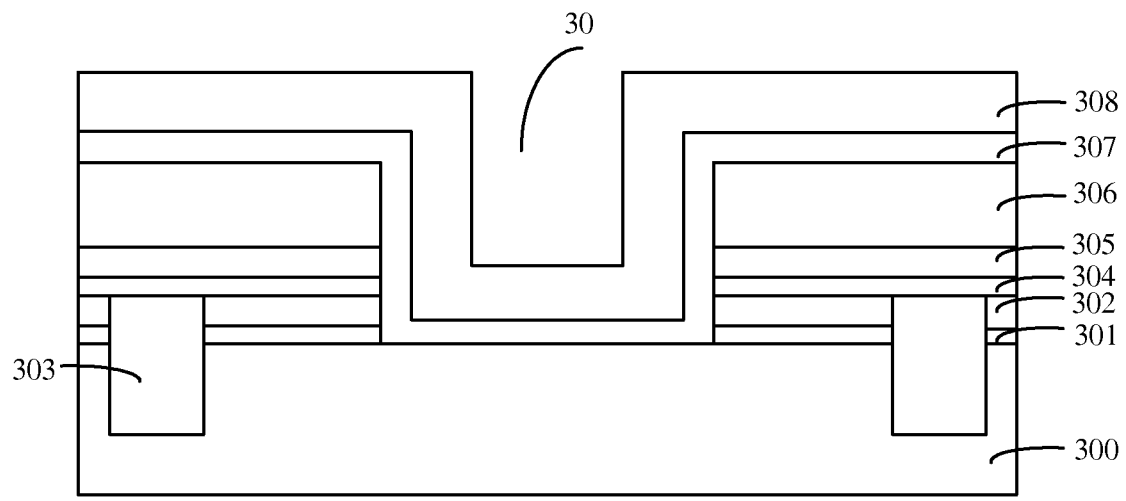

Referring to FIG. 6, a third dielectric layer 307 and a third polysilicon layer 308 are successively formed on the hard mask layer 306 and the opening 30's sidewalls and bottom surface.

The third dielectric layer 307 is adapted for forming word line dielectric layers and the third polysilicon layer 308 is adapted for forming word lines in subsequent steps. The word line dielectric layers isolate the word lines from the floating gates and the control gates, and act as tunneling oxide layers between the word lines and the floating gates. The third dielectric layer 307 is formed by a thermal CVD process, and has a thickness ranging from about 100 Å to about 150 Å. The third polysilicon layer 308 is formed by a CVD process, and has a thickness ranging from about 2000 Å to about 3000 Å. The third polysilicon layer 308 includes doped polysilicon.

It should be note that, to improve the cell's stability, the thickness and width of the word lines formed in subsequent steps should meet certain requirements. Therefore, it is important to control the thickness of the third polysilicon layer 308, especially for the portions on the opening's sidewalls. The third polysilicon layer 308 is formed by CVD to cover the opening 30's sidewalls and bottom surface. Therefore, the aspect ratio of the opening 30 is required to be configured within a certain range. If the aspect ratio is too large, it may be difficult to deposit polysilicon to cover the opening's sidewalls, so that the polysilicon formed thereon may be too thin to form desired word lines. However, if the aspect ratio is small (which means the opening is wide), too much polysilicon may be formed on the bottom surface, which is also undesired. Therefore, as described above, the hard mask layer 306, including a thickness ranging about 2000 Å to about 4000 Å, is formed on the second polysilicon layer 305 to increase the total thickness of the multilayer stack because the second polysilicon layer 305, the second dielectric layer 304, the first polysilicon layer 302 and the first dielectric layer 301 are not thick enough. By choosing the thickness of the hard mask layer 306 within the above mentioned range, the multi-layer stack may has an appropriate thickness, the opening 30 formed therein may has a suitable aspect ratio, and thus the third polysilicon layer may have a desired thickness.

Figure 7:
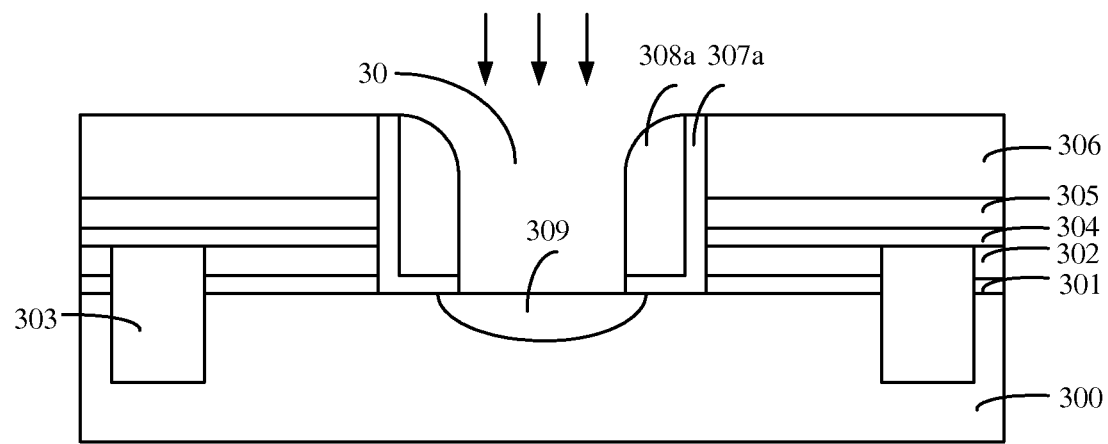

Referring to FIG. 7, a portion of the third dielectric layer 307 and a portion of the third polysilicon layer 308 are etched until the hard mask layer 306 and a portion of the substrate 300 are exposed, so as to form a word line 308a and a word line dielectric layer 307a on each of the opening 30's sidewalls. Ions are implanted into the substrate's exposed portion to form a source region 309 therein.

The third polysilicon layer 308 is etched with dry etching. And the third dielectric layer 307 is etched with wet etching.

The word line dielectric layer 307a has a L-sectional shape which includes one part between the opening 30's sidewall and the word line 308a's sidewall and another part between the substrate 300's top surface and the word line 308's bottom surface.

The ions implanted into the substrate are P-type boron ions. An annealing process is performed to the substrate 300 after the implantation to diffuse the ions to a portion of the substrate which is under the word line dielectric layer 307a.

Figure 8:
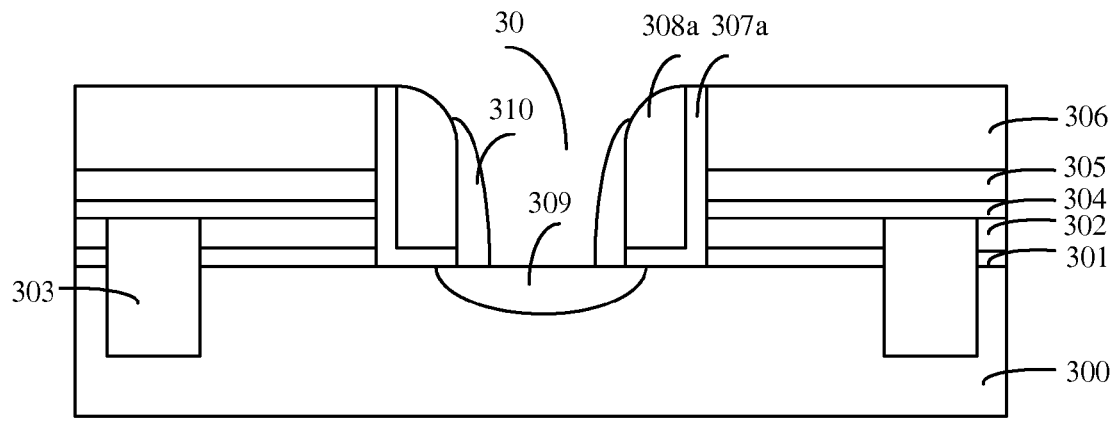
Figure 9:
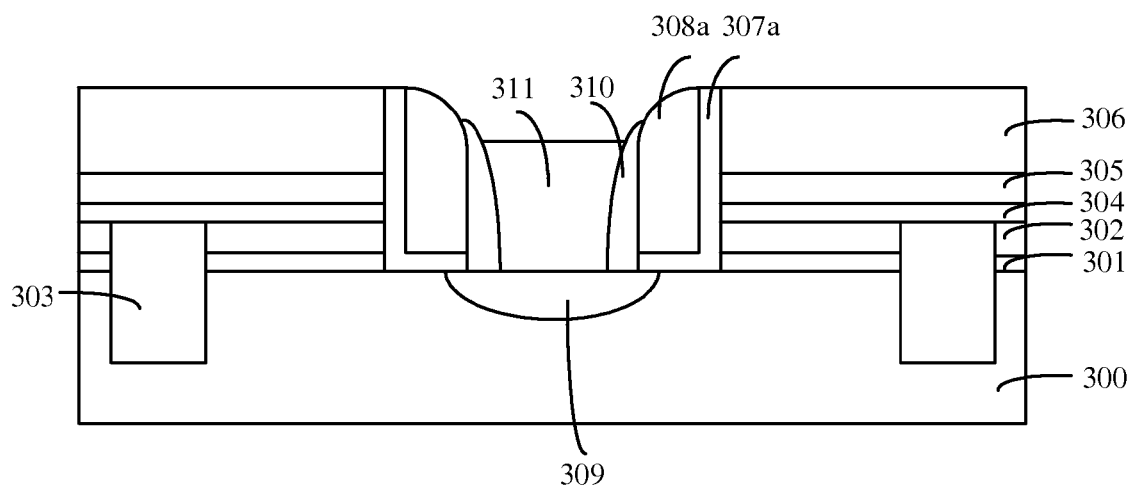

Referring to FIG. 8 and FIG. 9, a source line 311 is formed on the source region 309 and an isolating dielectric layer 310 is formed between the source line 311 and each word line 308a.

The source line 311 is formed as follows. On each sidewall of the opening 30, a spacer is formed over the word line dielectric layer 307a and a part of the word line 308a, the spacer is the isolating dielectric layer 310; the opening 30 is filled up with polysilicon which covers the word line 308a and the hard mask 306; a portion of the polysilicon is removed by CMP until the hard mask layer 306 is exposed; and the polysilicon in the opening 30 is etched back until an upper portion of the isolating dielectric layer 310 is exposed. The remaining polysilicon is the source line 311.

It should be noted that the source line 311's top surface is formed to be lower than the isolating dielectric layer 310's top surface, to ensure that the source line 311 and the word line 308a are isolated by the isolating dielectric layer 310, so that short circuit between the source line and the word line may be avoided, thereby improving the stability.

The isolating dielectric layer 310 includes silicon dioxide. And the polysilicon used for forming the source line 311 is doped with boron ions.

Figure 10:
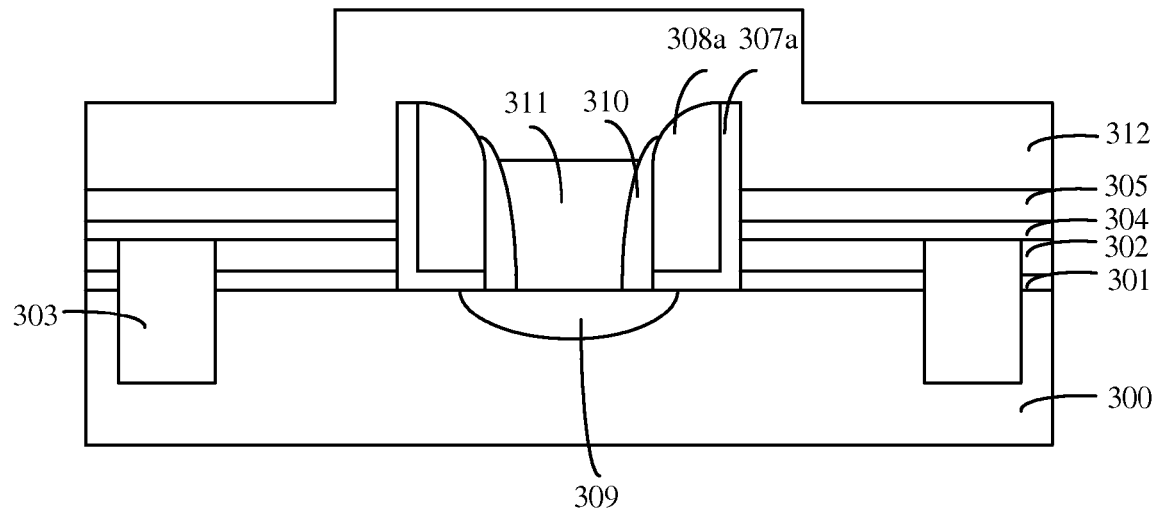

Referring to FIG. 10 and FIG. 11, the hard mask layer 306 (shown in FIG. 9) is removed and a first spacer 312a (which is formed by etching a silicon oxide layer 312 shown in FIG. 10) is formed on an outer sidewall of each word line dielectric layer 307a. Thereafter, by using the first spacer 312a as a mask, the second polysilicon layer 305, the second dielectric layer 304, the first polysilicon layer 302 and the first dielectric layer 301 are successively etched until the substrate 300 is exposed, so as to form a gate stack including a control gate 305a, a control gate dielectric layer 304a, a floating gate 302a and a floating gate dielectric layer 301a on each side of the source line.

The first spacer 312a includes silicon dioxide, which may effectively protect the substance below when it is etched to form the gate stack because a relatively high etching selectivity may be obtained with a silicon dioxide mask.

The first spacer 312a is formed as follows. The hard mask layer 306 (shown in FIG. 9) is removed; a silicon oxide layer 312 (shown in FIG. 10) is formed over the second polysilicon layer 305, the word line 308a, the word line dielectric layer 307a, the source line 311 and the isolating dielectric layer 310; and the silicon oxide layer 312 is etched to form a first spacer 312a on an outer sidewall of each word line dielectric layer 307a. During the formation of the gate stack by an etching process, the first spacer 312a also protects the word line dielectric layer 307a from being etched.

Referring to FIG. 12, a drain region 314 is formed in the substrate 300 on an outer side of each gate stack; and a second spacer 313 is formed over an outer sidewall of each gate stack.

The second spacer 313, including silicon nitride, is adapted for protecting the outer sidewall of each gate stack.

The drain region 314 is formed by ion implantation. The implanted ions are P-type. An annealing process is further performed to the substrate 300 after the ion implantation to diffuse the implanted ions to a portion of the substrate beneath each floating gate dielectric layer 301a.

After the formation of the second spacer 313 and the drain region 314, conductive plugs are formed on the drain region 314, the source line 311 and the word line 308a. The conductive plug formed on each drain region 314 is coupled to a bit line (not shown in FIG. 12) which is a metal wire in parallel to a direction from the drain region 314 to the source region 309.

A flash memory cell is formed by the method provided by the embodiment of the present disclosure. Referring to FIG. 12, the flash memory cell includes: a substrate 300; a source line 311 on the substrate 300; a word line 308a and a word line dielectric layer 307a on each side of the source line 311, wherein the word line dielectric layer 307a includes a part disposed between the word line 308a and the substrate 300 and another part disposed on an outer sidewall of the word line 308a; an isolating dielectric layer 310 on each side of the source line 311 which isolates the source line 311 from the word line 308a and the word line dielectric layer 307a; a gate stack on an outer side of each word line dielectric layer 307a, wherein the gate stack includes a floating gate dielectric layer 301a, a floating gate 302a, a control gate dielectric layer 304a and a control gate 305a; a first spacer 312a, disposed on an outer sidewall of each word line dielectric layer 307a and on each control gate; and a source region 309 in the substrate 300 and in contact with the source line 311.

The flash memory cell formed by the method provided by the embodiment includes two flash memory bits sharing the same source line.

In the flash memory cell, the gate stack (which is the gate stack of the conventional storage transistor) including the control gate 305a, the control gate dielectric layer 304a, the floating gate 302a and the floating gate dielectric layer 301a, together with the word line 308a and the word line dielectric layer 307a (which is the gate stack of the conventional select transistor), are formed as an integral structure, so the conventional common doping region is no longer necessary. Further, the flash memory cell including the two flash memory bits, which share the same source region and the same source line, can store two bits of data. Compared with the conventional memory cell including the storage transistor and the select transistor disposed in the split-style, the size of the memory cell is reduced and the manufacturing costs are decreased.

FIG. 13 is a schematic top view of a flash memory block including a plurality of flash memory cells according to an embodiment of the present disclosure. Referring to FIG. 13, the flash memory block includes: isolating structures 40; a plurality of flash memory cells, wherein the flash memory cells disposed between a pair of neighbouring isolating structures 40 share a same source line; source lines SL; word lines WL1-1, WL1, WL1+1 and WL1+2; bit lines BL1-1, BL1, BL1+1 and BL1+2; and control lines CG1, CG1+1, CG2 and CG2+1.

Each flash memory cell in the block includes two bits sharing the same source line. Each source line SL is formed by coupling the source lines of the flash memory cells in the same row. Each bit line in the block is formed by coupling the bit lines of the flash memory cells in the same column. The bit lines are coupled to the drain regions of the flash memory cells. The control lines are coupled to gate stacks 50, or precisely speaking, to the control gates of the flash memory cells.

It should be noted that, only a block of a flash memory is shown in FIG. 13, which is merely an example and should not limit the scope of the present disclosure.

|  |  | WL | CG1 | BL1 | SL | CG2 | CG1+1 | CG2+1 | BL1−1 | BL1+1 | BL1+2 | WL1±1 | WL1+2 | NW |
|---|---|---|---|---|---|---|---|---|---|---|---|---|---|---|
| Program | Bit1 | F | 8 V | −5 V | F | F | F | F | F | F | F | F | F | 2.5 V |
| Read | Bit1 | −3.3 V | 0 V | −1.5 V | 0 V | 0 V | 0 V | 0 V | 0 V | 0 V | 0 V | 0 V | 0 V | 0 V |
| Erase | All Bit | 8 V | −7 V | 0 V | F | −7 V | −7 V | −7 V | 0 V | 0 V | 0 V | 8 V | 8 V | 0 V |

The table above illustrates the voltages applied on: the source lines SL; the word lines WL1−1, WL1, WL1+1 and WL1+2; the bit lines BL1−1, BL1, BL1+1 and BL1+2; and the control lines CG1, CG1+1, CG2 and CG2+1, during a programming process, a reading process and an erasing process performed to the block shown in FIG. 13. The column NM illustrates the voltages applied on the N-well in the substrate in different processes. Bit 1 represents a target flash memory bit 60 in FIG. 13. All bits represent all the flash memory bits in FIG. 13. The programming process and the reading process are performed to the target flash memory bit 60 as an example. The erasing process is performed to all the flash memory bits in the block. The values of the voltages illustrated in the table above are merely for illustration and not limitation. In other embodiments, other voltage values may also be practical to perform the programming, reading and erasing processes.

As an example, the target flash memory bit 60 is the flash memory bit on the right side of the source line 311 shown in FIG. 12.

Referring to FIG. 13 in conjunction with FIG. 12, the programming process to the target memory bit 60 is performed as follows. A positive voltage of 8V is applied on the control line CG1 coupled to the control gate 305a, a negative voltage of 5V is applied on the bit line BL1 coupled to the drain region 314, the word line 308a and the source line 311 are opened, and a positive voltage of 2V is applied on the N-well in the substrate 300. Other voltage input ends in FIG. 13 are opened. The voltage level of the control gate 305a is higher than the voltage level of the drain region 314. Therefore, electrons in the drain region 314 tunnel into the floating gate 302a through the floating gate dielectric layer 301a, which accomplishes the programming process. The tunneling current is a gate induced drain leakage (GIDL) current which is very small, thereby reducing the power consumption and shrinking the size of a charge pump providing the negative voltage to the bit line BL1. Therefore, the sizes of capacitances which providing the charge pumps in the circuit design and the area of a chip may be decreased.

The reading process to the target memory bit 60 is performed as follows. The control line CG1 coupled to the control gate 305a is grounded, a negative voltage of 3.3V is applied on the word line 308a, a negative voltage of 1.5V is applied on the bit line BL1 coupled to the drain region 314, and the N-well in the substrate 300 is grounded. Other voltage input ends in FIG. 13 are also opened. The storage state of the target memory bit 60 is judged by testing the magnitude of the current flowing between the source region 309 and the drain region 314. If there are electrons stored in the floating gate 302a, the channel region is open and there is a current between the source region 309 and the drain region 314. If there are no electrons stored in the floating gate 302a, the channel is closed and there is no current between the source 309 and the drain 314.

The erasing process to the block shown in FIG. 13 is performed as follows. A positive voltage of 8V is applied on the word lines WL1−1, WL1, WL1+1 and WL1+2. A negative voltage of 7V is applied on the control lines CG1, CG1+1, CG2 and CG2+1 which are coupled to the control gates of the flash memory bits. The bit lines BL1−1, BL1, BL1+1 and BL1+2 which are coupled to the drain regions of the flash memory bits are all grounded. The source lines SL are opened. The N-well in the substrate 300 is grounded. All the electrons stored in the floating gates of the flash memory bits are transferred into the word lines across the word line dielectric layers, resulting in erasing all the flash memory bits shown in FIG. 13. In the erasing process, the electrons tunnel from the polysilicon of the floating gates to the polysilicon of the word lines. Polysilicon includes crystalline grains with different orientations. The electric field on the surface of the polysilicon in the word lines may be thus enhanced, which benefits the Fowler-Nordheim tunneling of the electrons in the floating gates. Therefore, the voltage applied on the word lines may be reduced. The erasing speed and efficiency of the flash memory is improved compared with the conventional EEPROM. That is because in the flash memory cell, all the flash memory bits in a block can be erased in one erasing process, but in the conventional EEPROM, only one memory bit can be erased in one erasing process. Further, the costs may be reduced.

In conclusion, the flash memory cell is formed with self-alignment technique. Furthermore, a common doping region between the conventional select and storage transistors is no longer necessary, which contributes to shrinking the memory cell's size and reducing the manufacturing costs.

The disclosure is disclosed, but not limited, by preferred embodiments as above. Based on the disclosure of the disclosure, those skilled in the art can make any variation and modification without departing from the scope of the disclosure. Therefore, any simple modification, variation and polishing based on the embodiments described herein is within the scope of the present disclosure.

What is claimed is:

1. A method for forming a flash memory cell, comprising:
   providing a substrate;
   successively forming a first dielectric layer, a first polysilicon layer, a second dielectric layer, a second polysilicon layer and a hard mask layer on the substrate;
   successively etching the hard mask layer, the second polysilicon layer, the second dielectric layer, the first polysilicon layer and the first dielectric layer to form an opening to expose a portion of the substrate;
   successively forming a third dielectric layer and a third polysilicon layer over the hard mask layer and the opening's sidewalls and bottom surface;
   etching the third polysilicon layer and the third dielectric layer to expose the hard mask layer and a portion of the substrate, the remaining third polysilicon layer and the remaining third dielectric layer forming a word line and a word line dielectric layer on each of the opening's sidewalls;
   implanting ions into the exposed portion of the substrate to form a source region;
   forming a source line on the surface of the source region of the exposed semiconductor substrate, and an isolating dielectric layer between the source line and each word line;
   removing the hard mask layer;
   forming a first spacer on a side of each word line dielectric layer away from the word line; and
   successively etching the second polysilicon layer, the second dielectric layer, the first polysilicon layer and the first dielectric layer with the first spacers as a mask until the substrate is exposed, to form a gate stack comprising a control gate, a control gate dielectric layer, a floating gate and a floating gate dielectric layer on each side of the source line.

2. The method according to claim 1, wherein forming the source line comprises:
   forming a spacer over the word line dielectric layer's sidewall and part of the word line's sidewall, wherein the spacer acts as an isolating dielectric layer between the word line and the source line to be formed;
   filling the opening up with polysilicon until the polysilicon covers the word lines and the hard mask layer;
   chemical mechanical polishing the polysilicon until the hard mask layer is exposed; and
   etching back the polysilicon in the opening to expose the word line and part of the isolating dielectric layer.

3. The method according to claim 1, wherein the source line's top surface is lower than the isolating dielectric layer's top surface.

4. The method according to claim 1, further comprising forming isolating structures in the semiconductor substrate, which extends into the first dielectric layer and further into the first polysilicon layer.

5. The method according to claim 1, wherein the first dielectric layer, the second dielectric layer and the third dielectric layer comprise silicon dioxide.

6. The method according to claim 1, wherein the hard mask layer comprises silicon nitride.

7. The method according to claim 1, wherein the hard mask layer comprises a thickness ranging from about 2000 Å to about 4000 Å.

8. The method according to claim 1, wherein the first spacer comprises silicon dioxide.

9. The method according to claim 1, wherein the third dielectric layer is formed by a high temperature CVD process.

10. The method according to claim 1, further comprising forming a second spacer on a sidewall of the gate stack on a side of the gate stack away from the source line, after the gate stack is formed.

11. The method according to claim 10, wherein the second spacer comprises silicon nitride.

12. The method according to claim 1, further comprises forming a drain region in the substrate on a side of each gate stack away from the source line after the gate stack is formed.

* * * * *